United States Patent
Min et al.

(10) Patent No.: US 9,601,614 B2
(45) Date of Patent: Mar. 21, 2017

(54) COMPOSITE SEMICONDUCTOR DEVICE WITH DIFFERENT CHANNEL WIDTHS

(71) Applicants: Won Gi Min, Chandler, AZ (US); Pete Rodriquez, Phoenix, AZ (US); Hongning Yang, Chandler, AZ (US); Jiang-Kai Zuo, Chandler, AZ (US)

(72) Inventors: Won Gi Min, Chandler, AZ (US); Pete Rodriquez, Phoenix, AZ (US); Hongning Yang, Chandler, AZ (US); Jiang-Kai Zuo, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 11 days.

(21) Appl. No.: 14/669,415

(22) Filed: Mar. 26, 2015

(65) Prior Publication Data

US 2016/0284841 A1    Sep. 29, 2016

(51) Int. Cl.
| | |
|---|---|
| H01L 29/78 | (2006.01) |
| H01L 27/02 | (2006.01) |
| H01L 29/08 | (2006.01) |
| H01L 29/66 | (2006.01) |
| H01L 29/06 | (2006.01) |
| H01L 29/10 | (2006.01) |

(52) U.S. Cl.
CPC ...... *H01L 29/7816* (2013.01); *H01L 27/0211* (2013.01); *H01L 29/0696* (2013.01); *H01L 29/0847* (2013.01); *H01L 29/1033* (2013.01); *H01L 29/1095* (2013.01); *H01L 29/66681* (2013.01); *H01L 29/7835* (2013.01); *H01L 29/0653* (2013.01); *H01L 29/1045* (2013.01)

(58) Field of Classification Search
CPC .................................................. H01L 29/7816
See application file for complete search history.

(56) References Cited

U.S. PATENT DOCUMENTS

| | | |
|---|---|---|
| 6,468,878 B1 | 10/2002 | Petruzzello et al. |
| 6,593,605 B2 | 7/2003 | Chung et al. |
| 7,262,476 B2 | 8/2007 | Bude et al. |

(Continued)

FOREIGN PATENT DOCUMENTS

WO    2015008473 A1    1/2015

OTHER PUBLICATIONS

Khemka et al., "Detection and Optimization of Temperature Distribution Across Large-Area Power MOSFETs to Improve Energy Capability", IEEE Transactions on Electron Devices, Jun. 2004, pp. 1025-1032, vol. 51, No. 6.

(Continued)

*Primary Examiner* — Lex Malsawma

(57) ABSTRACT

A device includes a semiconductor substrate, a first constituent transistor including a first plurality of transistor structures in the semiconductor substrate connected in parallel with one another, and a second constituent transistor including a second plurality of transistor structures in the semiconductor substrate connected in parallel with one another. The first and second constituent transistors are disposed laterally adjacent to one another and connected in parallel with one another. Each transistor structure of the first plurality of transistor structures has a lower resistance in a saturation region of operation than each transistor structure of the second plurality of transistor structures.

20 Claims, 5 Drawing Sheets

(56) References Cited

U.S. PATENT DOCUMENTS

| | | |
|---|---|---|
| 7,851,889 B2 | 12/2010 | Zhu et al. |
| 9,165,918 B1 * | 10/2015 | Yang .................. H01L 27/0248 |
| 2002/0047140 A1 * | 4/2002 | Moller .............. H01L 21/26586 |
| | | 257/262 |
| 2002/0109184 A1 | 8/2002 | Hower et al. |
| 2009/0206420 A1 | 8/2009 | Stecher et al. |
| 2016/0172485 A1 | 6/2016 | Yanagi |

OTHER PUBLICATIONS

U.S. Appl. No. 14/272,027, filed May 7, 2014.
Extended European Search Report for Patent Appln. No. 16162195.8 (06-082016).

* cited by examiner

US 9,601,614 B2

COMPOSITE SEMICONDUCTOR DEVICE WITH DIFFERENT CHANNEL WIDTHS

FIELD OF INVENTION

The present embodiments relate to semiconductor devices and, more specifically, power and other semiconductor devices having transistor structure arrangements.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode, and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor device is a laterally diffused metal-oxide-semiconductor (LDMOS) transistor device. In an LDMOS device, a drift space is provided between the channel region and the drain region.

LDMOS transistor devices are often characterized by a safe operating area, in which the operating current and voltage levels are below levels that would result in device destruction or other damage. The electrical safe operating area of a device relates to the generation of secondary charge carriers through impact ionization. In an n-channel LDMOS transistor device, electrons may generate additional electron-hole pairs via impact ionization after being accelerated in a region having a high electric field, such as near the drain boundary. If a sufficient number of holes—the secondary charge carriers—are created to raise the potential of the body of the LDMOS device to an extent that the junction with the source is forward biased, the resulting injection of the holes across the junction can activate a parasitic npn bipolar transistor formed via the source (emitter), body (base), and drain (collector) regions of the LDMOS transistor device. Very large, damaging currents can occur via the activation of the parasitic bipolar transistor, an operating condition referred to as "snapback."

Damage may also occur in LDMOS transistor devices when operated outside of a thermal safe operating area of the device. The thermal safe operating area specifies the voltage and current levels in which the device may operate without damage arising from excessive heat. In some cases, the energy handling capability of a device leads to a thermal operating area more restrictive than the electrical safe operating area.

Attempts to remain within both the electrical safe operating area and the thermal safe operating area are often undesirably limiting factors for device operation and application. For example, applications in which a large LDMOS transistor device is connected to an inductive load may involve switching transients that drain large amounts of energy from the inductive load to the LDMOS transistor device. LDMOS transistor devices may thus experience thermal and/or electrical failure during switching.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
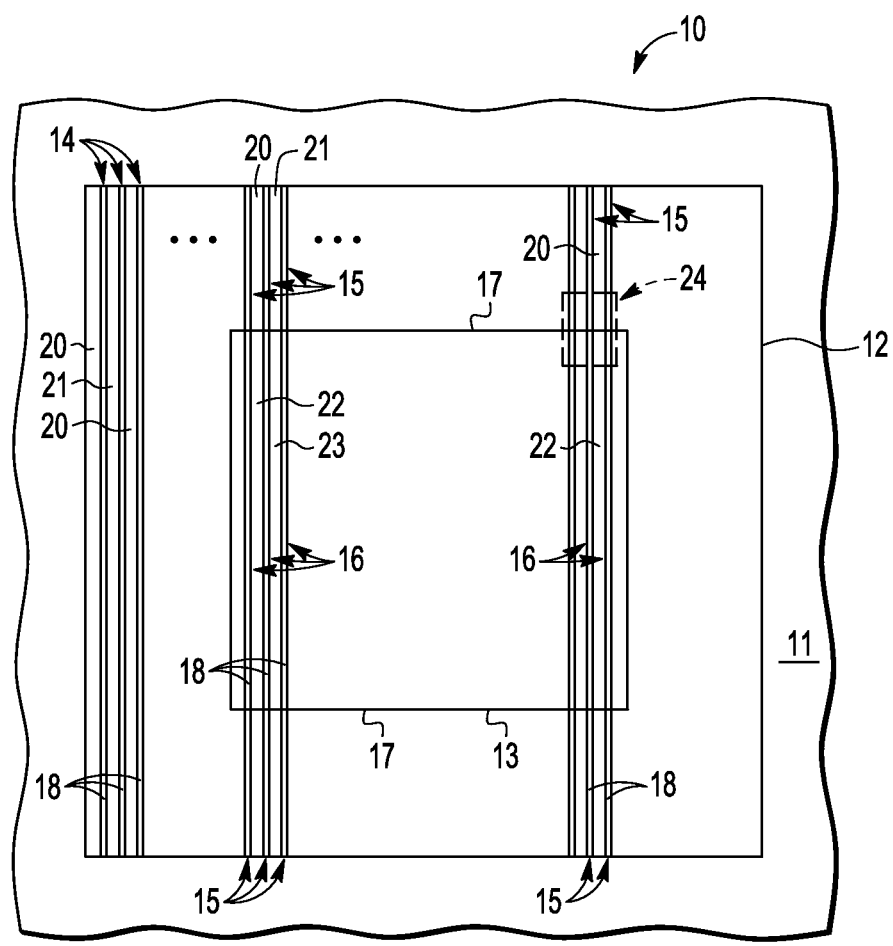
FIG. 1 is a schematic, plan view of an exemplary composite LDMOS transistor device having constituent transistor devices with resistance and current levels in accordance with one embodiment.

Embodiments of composite laterally diffused metal oxide semiconductor (LDMOS) and other semiconductor devices and electronic apparatus are described, along with methods of fabricating such devices and apparatus. The composite devices include a number of constituent devices arranged in a manner to reduce the likelihood of thermal failure. The constituent devices are arranged in accordance with the recognition that thermal failure often occurs at or near the center of a power transistor device, such as an LDMOS transistor device. The temperatures reached at the center of a power transistor device may be higher than at or near the periphery of the device. Heat generated at the periphery may be closer to a heat sink, such as the edge of the device. In contrast, heat sinks may not be available or sufficiently near the device center to remove the heat generated in the interior of the device.

The disclosed embodiments may be useful in connection with LDMOS transistor a other devices having a large or very large area in which excessive heat may be generated through self heating. For example, such self heating may occur in an LDMOS transistor device when high current and large drain voltages are present. Energy absorbed during a short period of time may otherwise cause a dramatic rise in temperature and lead to destruction of the device.

In most cases, the heat at device center is transferred through a temperature gradient from center to edge where the heat is removed from a nearby sink. As the gradient increases, the thermal energy is transferred faster. A balance may thus be reached between the heat generation and the heat dispassion when the temperature gradient rises to a certain level. The balance implies that the center portion of a large device (e.g., a large LDMOS transistor device) may be very hot relative to the periphery of the device. The device center may thus be the weakest part, or the part that undergoes thermal destruction.

The arrangement or layout of the constituent transistors of the composite devices is configured to improve the thermal safe operating area (SOA) of the composite device. In two-transistor (2T) embodiments, one of the transistors may be disposed at the center of the composite device. The other one of the transistors may be disposed along the periphery of the device. For example, the peripheral or outer device may surround the central or inner device. The central transistor has a high (or higher) resistance in a saturation region of operation. The peripheral transistor has a low (or lower) resistance in the saturation operational region. The central transistor may thus have a lower current level per unit area than the peripheral transistor for a given operational state (e.g., a given gate bias voltage and a given drain bias voltage). The lower drain current per unit area in the central device may lead to lower power and, thus, lower heat generation, in the device interior. The different resistance levels may be achieved via different effective channel widths in the respective transistors. The low (or lower) resistance may correspond with a baseline effective channel width for power transistor structures of the composite device.

The composite structure may effectively lower the interior or center temperature of the device and thereby increase the energy capability of the device. Lower drain current and power in the inner device may reduce heat generation in the middle of the composite device. A flatter, or more uniform, temperature profile may thus be achieved for the composite device. For instance, sharp peaks in operating temperature may be avoided. As a result, the thermal safe operating area, or energy capability, of the composite device may be increased. The devices of the disclosed embodiments may thus be capable of surviving higher energy stress.

The improved energy capability may be used to support higher operating voltage levels, higher operating current levels, and/or more compact device layouts, which may, for instance, support decreases in die size. The composite arrangement of the disclosed embodiments may achieve these and other aspects of an improved thermal SOA while avoiding other efforts directed to trying to flatten the temperature distribution within the device, such as, through reducing the input power at the center of the device.

The lower current level per unit area (or higher resistance in saturation) of the central (or inner) device(s) may be established through one or more photolithographic layouts. One photolithographic layout may be directed to forming source regions in the central and peripheral devices. Another photolithographic layout may be directed to forming body contact (or body tie) regions in such that the effective width of the channel of each transistor in the peripheral device is larger than the effective width of the channel of each transistor in the central device. The photolithographic layouts are configured such that the source region and the body contact region of each transistor structure are disposed in an alternating arrangement along a lateral dimension of the device. By changing the relative areas of the source region and the body contact region, the alternating arrangement may establish the effective channel width of each transistor structure. Enlarging the relative area of each body contact region in the central device reduces the effective channel width of each transistor structure in the central device. The narrower width of the channels in the central device may reduce the drain current in the transistor structures of the central device relative to that in the peripheral device.

The difference in effective channel width may be useful for reasons in addition to qimprovements in energy capability. For example, the increased area of the body contact regions in the central device effectively decreases the resistance of the body conduction path for secondary charge carriers (e.g., carriers created as a result of ionization). The lower resistance of the body conduction path lowers the voltage increase caused by the secondary charge carriers, thereby reducing the likelihood that the parasitic bipolar transistor device is activated. Parasitic bipolar snapback may thus be suppressed, thereby avoiding device destruction and further increasing device energy capability.

These and other features of the disclosed embodiments may be achieved without significant degradation in device performance. For instance, the on-resistance of the composite device may only increase a small amount, e.g., about 3%, in return for a much larger (e.g., about 50%) improvement in energy capability. With no significant increase in the overall on-resistance of the composite device, there is no need to enlarge the area of the composite device. For these and other reasons, the disclosed embodiments may provide a robust semiconductor device well suited for inductive loads and other applications involving higher energy capabilities.

The operational and other characteristics of the constituent devices may be similar with the exception of, and despite, the difference in effective channel widths. For example, each constituent device may include a plurality of transistor structures disposed in a periodically repeating source-gate-drain arrangement. In that arrangement, adjacent transistor structures may share either a common source or a common drain.

FIG. 1 is a schematic plan view of an example of a composite LDMOS transistor device 10 constructed in accordance with one embodiment. The device 10 includes a semiconductor substrate 11 in which a number of constituent transistor devices are formed. The constituent transistor devices are connected in parallel with one another to establish the composite LDMOS transistor device 10. The parallel connection of the constituent transistor devices may involve a number of shared terminals, including, for instance, a shared source terminal, a shared drain terminal, and a shared gate terminal. In this example, the device 10 includes a pair of constituent transistor devices, and may thus be considered a two-transistor, or 2T, composite device. The constituent transistor devices include a peripheral or outer constituent transistor 12 and a central or inner constituent transistor 13. The constituent transistors 12, 13 are disposed laterally adjacent one another. In this example, the constituent transistors 12, 13 are contiguous with one another. Additional or alternative constituent transistor devices may be provided.

The peripheral constituent transistor 12 includes an array of transistor structures 14, 15 in the semiconductor substrate connected in parallel with one another. Each transistor structure 14, 15 is elongated in a respective one of a plurality of parallel rows (or columns) oriented in a first lateral direction or dimension of the device 10. For ease in description, the first lateral dimension is referred to herein as the length of the device 10. Each transistor structure 14 extends laterally across the full length of the device 10. In contrast, each transistor structure 15 does not extend across the full length of the device 10, but rather extends only across a portion of the length of the device 10 on one of two opposing sides of the central constituent transistor 13. Adjacent transistor structures 14, 15 in the array are disposed alongside and spaced from one another in a second lateral direction or dimension orthogonal to the length direction (i.e., the width of the device 10). Any number of transistor structures 14, 15 may be provided. For example, the device 10 may include about two hundred or more transistor structures.

The central constituent transistor 13 includes an array of transistor structures 16 disposed in the semiconductor substrate 11 and connected in parallel with one another. Each transistor structure 16 extends laterally across the full length of the central constituent transistor 13. Each transistor structure 16 abuts, or is otherwise lengthwise adjacent to, a respective pair of the transistor structures 15 at a boundary 17 between the constituent transistors 12, 13. In this example, each transistor structure 16 is contiguous with a respective pair of the transistor structures 15 at the boundary 17, with each transistor structure 15 disposed at a respective end of the transistor structure 16. The abutting transistor structures of the constituent transistors 12, 13 are contiguous with one another in the direction (e.g., the length direction) orthogonal to the lateral direction in which channels and/or conduction paths of each transistor structure 14, 15, 16 are oriented. Examples of the conduction paths of the transistor structures 14, 15, 16 are shown and described in connection with FIGS. 3-5.

The transistor structures 14, 15 of the constituent transistor 12 may laterally surround the transistor structures 16 of the constituent transistor 13. In the embodiment of FIG. 1, the transistor structures 16 of the constituent transistor 13 are centered within the transistor structures 14, 15 of the constituent transistor 12. Other arrangements may be used, examples of which are shown and described in connection with FIGS. 5 and 6.

Abutting transistor structures 15, 16 are aligned with one another. The alignment of the adjacent transistor structures 15, 16 allows common gate structures to be shared by the adjacent transistor structures 15, 16. In the LDMOS example of FIG. 1, each transistor structure 14, 15, 16 includes a gate 18 supported by the semiconductor substrate 11. Each gate 18 extends the entire length of the device 10. Abutting transistor structures 15, 16 may thus share a respective one of the gates 18. In the example of FIG. 1, the device 10 is depicted as having a uniform gate pitch for ease in illustration. As shown in the more detailed view of FIG. 2, the gate pitch may be non-uniform. The gate pitch may vary, and may be either uniform or non-uniform.

The transistor structures 14, 15, 16 disposed in adjacent rows (or columns) (e.g., those structures adjacent in the width direction of the device 10) may share one or more regions or components. The shared regions or components may be disposed on a source side and/or a drain side 21 of the transistor structures 14, 15, or on a source side 22 and/or a drain side 23 of the transistor structures 16. For example, a pair of adjacent transistor structures 14 may share a common source region and a common body region on the source side 20 of the transistor structures 14. Other adjacent transistor structures 14 may share a common drain region and a common drift region on the drain side 21 of the transistor structures 14. In the example of FIG. 1, adjacent transistor structures 14 share components on either the source side 20 or the drain side 21, alternating therebetween. Adjacent transistor structures 15 may be similarly configured and arranged. Adjacent transistor structures 16 may also be similarly configured and arranged in alternating fashion along the source and drain sides 22, 23.

A portion 24 of the device 20 is referenced in FIG. 1 to highlight the boundary 17 between the transistors 12, 13. The layout of the device 10 in the portion 24 is schematically shown in greater detail in FIG. 2.

Figure 2:
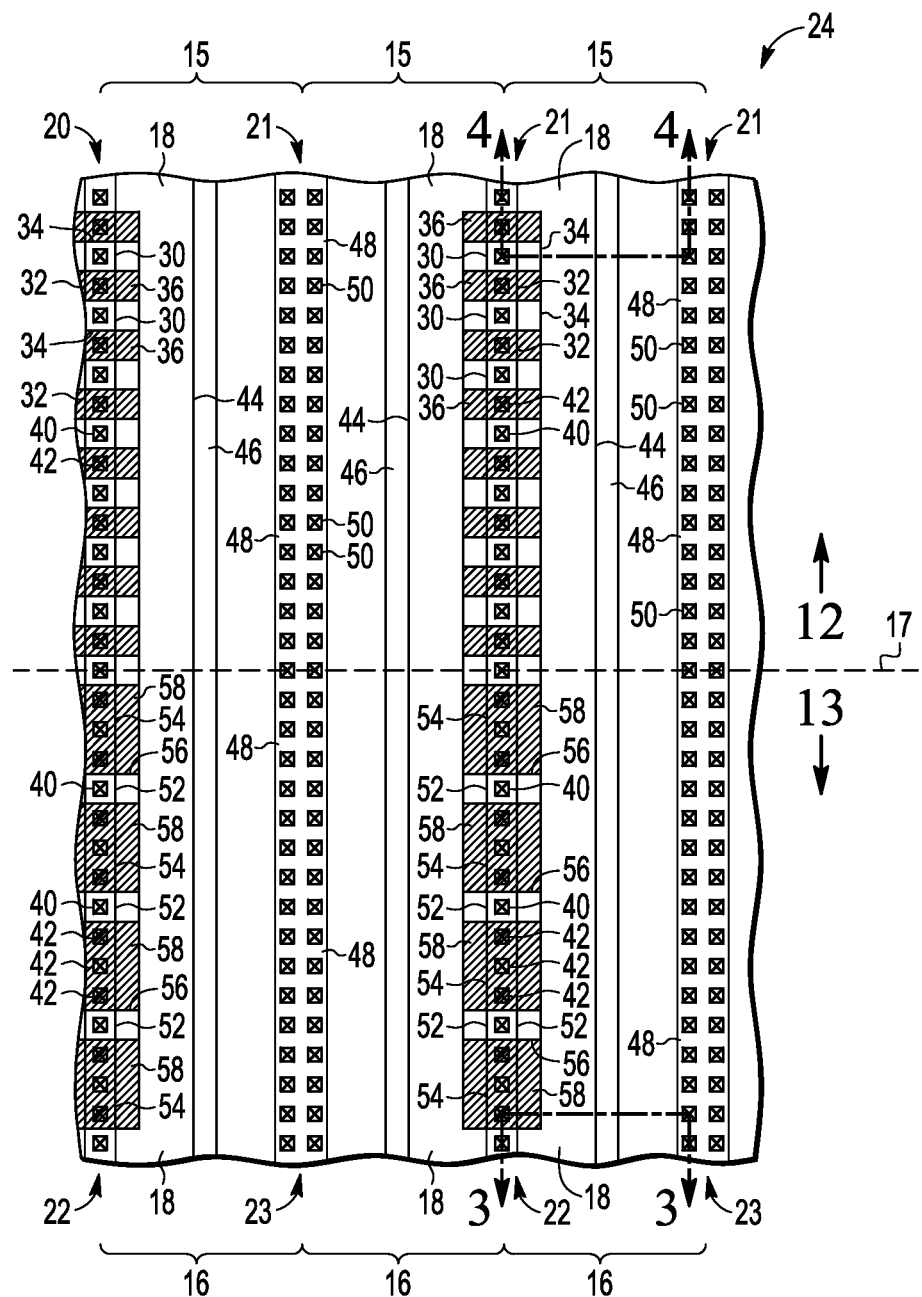
FIG. 2 is a partial, schematic, plan view of the composite LDMOS transistor device of FIG. 1 to depict constituent transistor devices of the composite LDMOS transistor device in greater detail.

FIG. 2 depicts three adjacent transistor structures 15 of the constituent transistor 12 and three adjacent transistor structures 16 of the constituent transistor 13. Each one of the transistor structures 15 is contiguous and aligned with a respective one of the transistor structures 16 along the boundary 17. The aligned transistor structures 15, 16 abut one another end-to-end. The aligned transistor structures 15, 16 share one of the gates 18. The gates 18 thus extend across the boundary 17. Each gate 18 is shared by a respective one of the transistor structures 15 and a respective one of the transistor structures 16.

The source sides 20 of the transistor structures 15 include source regions 30 and body contact regions 32 disposed in a laterally alternating arrangement. In this example, the source and body contact regions 30, 32 alternate laterally along the length direction. The source regions 30 and the body contact regions 32 are shared by the pair of adjacent transistor structures 15. The source regions 30 are formed by implantation of dopant (e.g., n-type dopant) through openings 34 configured via a photolithographic layout. The body contact regions 32 are formed by implantation of dopant (e.g., p-type dopant) through openings 36 configured via photolithography. The openings 34, 36 overlap the gates 18 such the source and body contact regions 30, 32 are self-aligned with edges 38 of the gates 18. The source and body contact regions 30, 32 are disposed within a body region (FIG. 4) shared by the transistor structures 15.

The source sides 20 of the transistor structures 15 include Ohmic contacts 40 and 42 for the source regions 30 and the body contact regions 32, respectively. In this example, two Ohmic contacts 40, 42 are provided for each source region 30 and each body contact region 32, respectively. Each Ohmic contact 40, 42 may include one or more metal layers supported by the semiconductor substrate 11 (FIG. 1). The Ohmic contacts 40, 42 may extend upward from a surface of the semiconductor substrate 11 to a metal layer in which an interconnect (not shown) is formed. The interconnect may run the length of the transistor structures 15 to electrically connect each of the source and body contact regions 30, 32. With that electrical connection, the source regions 30 may be considered constituent source regions of a collective source region for the transistor structure 15. The respective interconnects of the transistor structures 15 may then be electrically connected to one another (e.g., via one or more further interconnects) to connect the transistor structures 15 in parallel, thereby forming the constituent transistor 12.

The drain sides 21 of the transistor structures 15 are on an opposite side 44 of each gate 18. In this example, a sidewall spacer 46 is disposed along the opposite side 44. A drain region 48 is spaced from the gate 18 and the sidewall spacer 46. The drain region 48 includes a number of Ohmic contacts 50. Each drain region 48 is shared by the source regions 34 of two of the transistor structures 15. Further details regarding the drain sides 21 of the transistor structures 15 are provided in connection with the cross-sectional views of FIGS. 3 and 4.

The transistor structures 16 of the constituent transistor 13 are similar to the transistor structures 15 of the constituent transistor 12 in a number of ways. A number of regions, components, or other features of the transistor structures 16 are shared or otherwise configured similarly to the corresponding features of the pair of transistor structures 15. For example, the gates 18 are shared and thus identically configured on each side of the boundary 17. The drain regions 48 also extend across the boundary 17 and, thus, the features along the drain sides 23 may be identically configured to those of the transistor structures 15. Other identically or similarly configured features include the Ohmic contacts 40, 42. The interconnects and/or other structures used for connectivity and passivation may also be shared and, thus, identically configured.

The transistor structures 16 differ from the transistor structures 15 in one or more ways to modify the resistance of the transistor structures 16 in the saturation operational region. The transistor structures 15 have a lower resistance in the saturation operational region than the transistor structures 16. In the example of FIG. 2, the difference in resistance (and resulting current per unit area) is achieved through modifying the total body contact area and total source area, thereby modifying the effective channel width of each transistor structure 16. The effective channel width of each transistor structure 15 is larger than the effective channel width of each transistor structure 16. In some cases, the larger effective channel width of the transistor structures 15 is established by configuring the transistor structures 15 with smaller body contact area(s) than the transistor structures 16.

Figure 4:
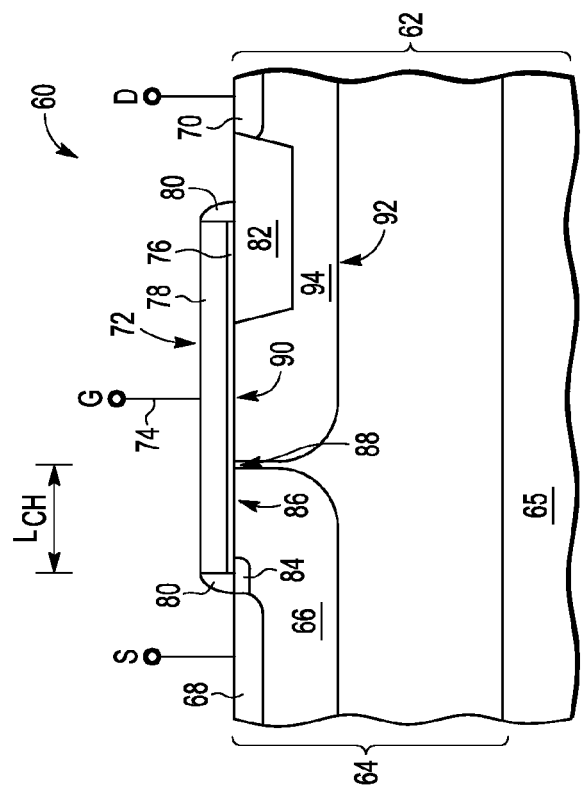
FIG. 4 is a partial, cross-sectional, schematic view of an exemplary transistor structure of another one of the constituent transistor devices of FIGS. 1 and 2 taken along lines 4-4 of FIG. 2 in accordance with one embodiment.
Figure 3:
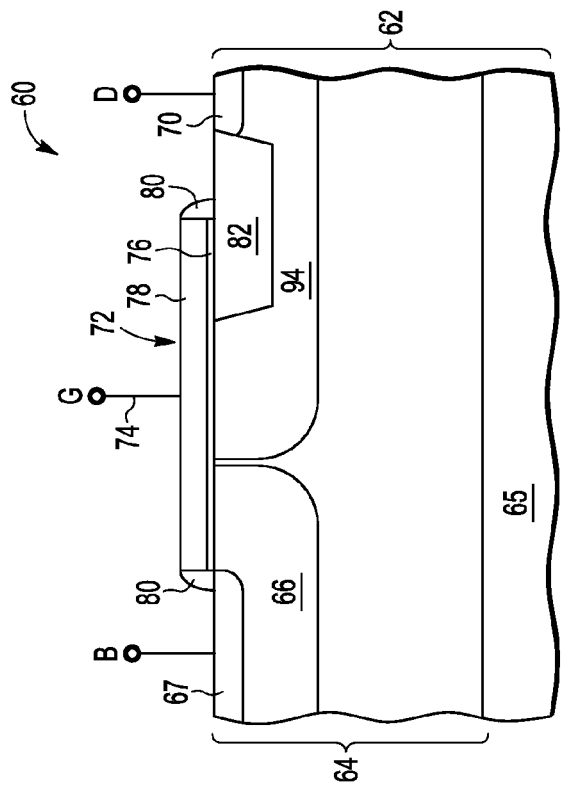
FIG. 3 is a partial, cross-sectional, schematic view of an exemplary transistor structure of one of the constituent transistor devices of FIGS. 1 and 2 taken along lines 3-3 of FIG. 2 in accordance with one embodiment.

The channel of each transistor structure 15 is located under the gate 18 between the source region 30 and the drain region 48. The channel of each transistor structure 16 is located under the gate 18 between the source region 52 and the drain region 48. Exemplary channels are shown in FIGS. 3 and 4. The length of each channel is established by the width of the gate 18. The effective width of each channel of the transistor structure 15 is established by the size (e.g., collective length) of the source regions 30. The effective width of each channel of the transistor structure 16 is established by the size (e.g., collective length) of the source regions 52.

The source sides 22 of the pair of transistor structures 16 include alternating source regions 52 and body contact regions 54. As in the transistor structures 15, the source and body contact regions 52, 54 alternate laterally along the length of the device and are shared by each pair of adjacent transistor structures 16. The source regions 52 and the body contact regions 54 may be formed by the same dopant implantation procedures used to form the corresponding regions of the transistor structures 15.

The alternating arrangement of the source and body contact regions establishes the effective channel width of each transistor structure 15, 16. The relative sizes of the source regions 52 and the body contact regions 54 is established by the sizes of openings configured via photolithographic layout. In the example of FIG. 2, each source region 52 is defined by an opening 56. Each body contact region 54 is defined by an opening 58. As with the openings 34, 36 for the transistor structure 15, the openings 56, 58 overlap the gate 18. As a result, the source regions 52 and the body contact regions 54 are self-aligned with the gate 18.

The sizes of the openings 56, 58 in the length dimension of the device establish the effective channel width of each transistor structure 16. Likewise, the sizes of the openings 34, 36 in the length dimension of the device establish the effective channel width of each transistor structure 15. In the example of FIG. 2, the openings 56, 58 are configured such that each source region 52 has a smaller size in the channel-establishing dimension (e.g., the device length dimension) than each body contact region 54. In this case, each source region 52 is approximately one-third as long as each body contact region 54. Stated conversely, each body contact region 54 is about three times as long as each source region 52. Consequently, over the length of the alternating arrangement of each transistor structure 16, the collective size of the body contact regions 54 is greater than the collective size of the source regions 52 in the channel-establishing dimension.

The extent to which each source region 52 is shorter than each body contact region 54 may vary from the example shown.

In contrast, the transistor structures 15 have a larger effective channel width. The effective channel width is again established via the relative sizes of the source regions and the body contact regions 32. The transistor structures 15 have more of the device length dedicated to the source regions 30 than the transistor structures 16. In the example of FIG. 2, the source regions 30 have the same size in the channel-establishing dimension as the body contact regions 32. The source-to-body contact ratio is thus 1:1. In comparison, for the transistor structures 16 is 1:3.

Other ratios may be used for the transistor structures 15, 16. One or both ratios may differ from the example shown. For example, the transistor structures 16 may have a source-to-body contact ratio of 1:2. Alternatively or additionally, the transistor structures 15 may have a source-to-body contact ratio of 2:1. Various combinations of ratios may be used to optimize device performance (e.g., on-resistance, drain current, and/or other parameters of the composite device) and energy capability for a particular application.

Other alternating arrangements may be used to establish different effective channel widths. In some cases, other types of structures may be disposed between the source regions 30, 52. For example, a shallow trench isolation (STI) region may be incorporated into the alternating arrangement (e.g., one STI region for each source region 52 and each body contact region 54) to decrease the effective channel width of each transistor structure 16.

The higher resistance of the transistor structures 16 in the saturation operational region (and resulting lower current level per unit area) may be established in other ways. For example, the total area or size of the drain regions in the transistor structures 15, 16 may differ. Alternatively or additionally, the dopant concentration levels of other regions (e.g., the body regions may also be modified in the transistor structures.

In the example of FIG. 2, the boundary 17 between the adjacent transistor structures 15, 16 may be considered to be disposed in one of the source regions 30, 52. Because the source regions 30, 52 are similarly sized, a smooth or clear transition between the constituent transistor devices 12, 13 may accordingly be achieved. In other cases, the boundary 17 may be disposed in a neutral area (i.e., neither source nor body contact region), such as an STI region.

The drain sides 23 of the transistor structures 16 may be identical or similar to the drain sides 21 of the transistor structures 15. For instance, the drain sides 23 are also disposed along the edge 44 of each gate 18. In the embodiment of FIG. 2, the regions, components, and other features of the transistor structures 15, 16 along the drain sides 21, 23 may be configured identically or similarly. Further details regarding the features of the drain sides 23 are provided below in connection with the exemplary embodiments of FIGS. 3 and 4.

FIG. 2 shows how the transistor structures 15, 16 are not electrically isolated from one another in some cases. The transistor structures 15, 16 are not electrically isolated due to the lack or absence of an isolation region between the transistor structures 15, 16. Each transistor structure 15 abuts one of the transistor structures 16 without any intervening isolation region, such as a doped isolation ring or a DTI region. In examples in which an STI region is incorporated into one or both of the alternating source side arrangements described above, the transistor structures may still be considered to be not electrically isolated from one another because the transistor structures still share a common body region.

While FIG. 2 addresses the transition in the source side configuration between the abutting transistor structures 15, 16, the source side configuration also changes at or near the other sides of the boundary 17. The source side configuration also changes at the two sides of the boundary 17 that run parallel to the length of the transistor structures 15, 16. In the embodiment of FIG. 1, the boundary 17 along those sides may mark the location of the gate 18 of the last transistor structure 16 to have a source side configured with a halo region.

FIGS. 3 and 4 are schematic cross-sectional views of an example of a transistor structure 60 of the constituent transistor 13 (FIGS. 1 and 2) taken along lines 3-3 of FIG. 2 and/or of the constituent transistor 12 (FIGS. 1 and 2) taken along lines 4-4 of FIG. 2. The transistor structure 60 may be one of the transistor structures 15 (FIGS. 1 and 2) or one of the transistor structures 16 (FIGS. 1 and 2). In the cross-sectional views shown in FIGS. 3 and 4, the transistor structures of the constituent transistors 12, 13 may appear to be similar because the differences are instead in the other lateral dimension, as described above in connection with FIG. 2.

In the example of FIGS. 3 and 4, the transistor structure 60 is configured as an n-channel LDMOS transistor. The transistor structure 60 may be configured as a RESURF transistor structure. The transistor structure 60 is disposed in (and/or on) a semiconductor substrate 62 (e.g., the substrate 11 of FIG. 1), which may, in turn, include a number of epitaxial layers 64. In this example, the semiconductor substrate 62 includes a single p-type epitaxial layer 64 grown on an original or support substrate 65. The original substrate 65 may be a heavily doped p-type substrate. In other cases, the original substrate 65 may be lightly doped. The transistor structure 60 may alternatively or additionally include non-epitaxial layers in which one or more transistor regions are formed. Any one or more of the layers of the semiconductor substrate 62 may include silicon.

The structural, material, and other characteristics of the semiconductor substrate 62 may vary from the example shown. For example, the semiconductor substrate 62 may have a silicon-on-insulator (SOI) construction in which one or more buried insulator layers are disposed between the epitaxial layer 64 and the original substrate 65. The insulator layer may include silicon oxide. Additional, fewer, or alternative layers may be included in the semiconductor substrate 62. Any number of additional semiconductor and/or non-semiconductor layers may be included. For example, a buried doped layer may be disposed between the epitaxial layer 64 and the original substrate 65. The buried doped layer may be doped before the growth of the epitaxial layer 64. In some cases, the doped buried layer may assist in drift region depletion to support the RESURF effect. The disclosed devices are thus not limited to, for instance, substrates including epitaxially grown layers, or SOI substrates, and instead may be supported by a wide variety of other types of semiconductor substrates, including bulk substrates.

The transistor structure 60 is not individually isolated from adjacent transistor structures of the composite transistor device 10 (FIG. 1). Buried insulator or other layers may act as a lower or bottom boundary that electrically isolates the transistor structure 60 from the original substrate 65. But such layers do not isolate the transistor structure 60 from the other transistor structures of the composite transistor device 10. The transistor structure 60 does not include peripheral or other device isolation layers or regions in the semiconductor substrate 62 dedicated solely to laterally separating the transistor structure 60 from adjacent transistor structures. Any device isolation layer(s) or region(s), such as isolation wells or trench regions (e.g., DTI regions), may instead laterally and/or otherwise surround the outer periphery of the entire composite device 10. These layers or regions may be provided to act as a barrier that electrically isolates or separates the entire composite transistor device 10 (FIG. 1) from the rest of the substrate 62. In contrast, neither the constituent transistor devices 12, 13 (FIGS. 1 and 2) nor the individual transistor structures thereof are electrically isolated from one another.

The transistor structure 60 includes a device body or body region 66 in the semiconductor substrate 62. In this example, the body region 66 is a p-type well formed in the epitaxial layer 64 of the substrate 62. The p-type well may be configured for high voltage operation (e.g., high side operation). The body region 66 may be biased via one or more heavily doped p-type body contact regions 67 (FIG. 3) and corresponding electrodes or terminals (e.g., the Ohmic contact 42 of FIG. 2) formed in or otherwise above the p-type well of the body region 66 in the semiconductor substrate 62. The dopant concentration of each contact region 67 may be at a level sufficient to establish an Ohmic contact to the body region 66. As described above in connection with FIG. 2, the body contact regions 67 may be sized to establish an effective channel width. The body contact regions 67 are sized in the lateral dimension extending into and out of the drawing sheet of FIG. 3.

The transistor structure 60 includes heavily doped source and drain regions 68 (FIG. 4) and 70 in the semiconductor substrate 62. In the example of FIG. 3, the source and drain regions 68 and 70 are n-type doped portions of the epitaxial layer 64. The heavily doped n-type source region 68 is disposed within, on, and/or otherwise above the body region 66. The source and drain regions 68, 70, or a portion thereof, may have a dopant concentration at a level sufficient to establish Ohmic contacts with source and drain electrodes or terminals (e.g., Ohmic contacts 40, 502 of FIG. 2) for biasing the source and drain regions 68, 70, respectively.

The source and drain regions 68 and 70 are laterally spaced from one another in the lateral dimension shown in the cross-section of FIG. 3 (e.g., the width direction referenced above). Such spacing defines a conduction path of the transistor structure 60 between the source and drain regions 68 and 70. The conduction path may thus be oriented along the lateral dimension shown in FIG. 3. In some embodiments, the source and drain regions 68 and 70 may have additional or alternative lateral spacing. In this example, the transistor structure 60 shares the source region 68 with an adjacent transistor structure on one side, and shares the drain region 70 with another transistor structure adjacent the other side. Any number of source or drain regions may be provided. Other source/drain arrangements may be used. For example, the drain region 70 may not be shared or otherwise disposed between adjacent transistor structures.

The transistor structure 60 includes one of the gates 72 shared with abutting transistor structures, as described above. The gate 72 may be a composite structure formed on or above the surface of the semiconductor substrate 62. The gate 72 is disposed between the source region 68 and the drain region 70. Other gate arrangements may be used. For example, the gate structure 72 may include another structure supported by the substrate 62 closer to the drain region 70. The gate 72 may be biased via a gate terminal or other conductive interconnect 74 to control movement of charge carriers between the source and drain regions 68, 70 during operation. The gate 72 includes a gate dielectric 76, a conductive layer 78 on or over the gate dielectric 76, and sidewall spacers 80 along sidewalls of the gate dielectric 76 and the conductive layer 78. The gate dielectric 76 may include silicon dioxide (or oxide) deposited or otherwise formed on the surface of the semiconductor substrate 62. The conductive layer 78 may include a polysilicon plate. The gate dielectric 76 insulates the conductive layer 78 from the substrate 62. The sidewall spacers 80 may include a dielectric material disposed along lateral edges of the gate structure. The sidewall spacers 80 may cover the lateral edges to act as a silicide blocker to prevent a silicide short along the surface of the semiconductor substrate 62. The sidewall spacers 80 may provide spacing to separate the conductive components of the gate 72 from the source region 68 and other regions of the transistor structure 60. In this example, one of the sidewall spacers 80 is used for alignment purposes in defining an edge of the source region 68, as shown in FIG. 4.

The configuration of the gate 72 may vary. For example, the gate 72 may include multiple conductive layers (e.g., polysilicon plates). The components, materials, and other characteristics of the gate 72 may thus vary from the example shown.

A number of STI regions may be formed at the surface of the semiconductor substrate 62. In this embodiment, a single STI region 82 spaces the gate structure 18 from the high voltage applied to the drain region 70. The STI region 82 may be configured to prevent or minimize hot carrier injection (HCI) into the gate dielectric 76 of the gate 72. With the STI region 82, the transistor structure 60 may be configured as a field drift LDMOS transistor device. The field oxide (or other dielectric) may be provided via other structures in other embodiments. In alternative embodiments, the transistor structure 60 is configured as an active drift device.

In some embodiments, no further STI regions are disposed in the semiconductor substrate 62 within the device area of the device 10 (FIG. 1) beyond the STI regions 82 positioned to space gates 72 from respective drain regions 70. STI regions are not used to isolate or separate the transistor structure 60 from adjacent transistor structures, or to separate respective regions (e.g., the source and body contact regions 68, 67) of the transistor structure 60, from one another. Alternatively, one or more STI regions may be used to separate contact regions, Ohmic contacts, or other structures disposed at, or supported by, the surface of the semiconductor substrate 62.

The transistor structure 60 may be configured with one or more lightly or intermediately doped transition or extension regions (e.g., n-type lightly doped drain, or NLDD, regions) at or near the source and drain regions 68 and 70. In the example of FIG. 4, an extension region 84 is disposed adjacent the source region 68. The extension region 84 may be or include a diffused region formed in connection with the source region 68. The extension region 84 extends laterally under the gate 72. The extension or transition regions may assist in controlling the electric field at or near the surface, including in areas other than those areas near the source region 68 or the drain region 70.

When the gate 72 is biased, charge carriers (in this case, electrons; alternatively, holes) accumulate in one or more channel areas or regions 86 (FIG. 4). Each channel region 86 (or a portion thereof) may be located in the body region 66 under the gate 72. In this example, the accumulation of holes results in a charge inversion in the channel region 86 from the p-type body region 66 to an n-type conduction layer or area near the surface of the semiconductor substrate 62. Once a sufficient amount of the charge carriers accumulate in the conduction layer or area, charge carriers are capable of flowing from the source region 68 toward the drain region 70 through the channel region 86 of the body region 66. The length of the channel region 86 is indicated by a distance $L_{CH}$ in FIG. 4. The width of the channel region 86 is established in the lateral dimension transverse to the dimension in which the distance $L_{CH}$ is defined. The width of the channel region 86 is established via the width of the source region 68. The effective width of the channel of the transistor structure may then be established via the collective size of the source regions 68 in the width dimension.

The channel region 86 may include other regions or areas in the semiconductor substrate 62 in which charge inversion or accumulation occurs as a result of the bias applied to the gate 72. Charge carriers may also accumulate outside of or beyond the body region 66. In the example of FIG. 4, charge carriers may also accumulate in a portion 88 of the epitaxial layer 64 adjacent the body region 66. The portion 88 may, in some cases, be considered to be part of an accumulation region 90 (FIG. 4) of the device 20. The accumulation region 90 is a portion of a drift region 92 (FIG. 4) of the transistor structure 60 disposed under the gate 72 at or near the substrate surface. Charge carriers accumulate in the accumulation region 90 upon application of the gate bias voltage. The channel region 86 and the accumulation region 90 may form part of a conduction region or path of the transistor structure 60.

The conduction path is not limited to regions in which charge inversion or accumulation occurs or to regions in which conduction is enabled or enhanced via the bias voltage applied to the gate 72. The conduction path or regions are thus not limited to regions at or near the substrate surface. For example, the conduction path includes other portions of the drift region 92 through which charge carriers drift to reach the drain region 70. The drift region 92 may electrically couple the drain region 70 and the channel region 86. In this example, the drift region 92 is formed with, and/or includes, an n-type well 94 under the STI region 82. As described below, the drift region 92 may be defined through a dopant implantation to form the n-type well 94 and a subsequent thermal anneal (or other fabrication process) during which heating leads to dopant diffusion that distributes the dopant under the drain region 70.

The drift region 92 (and/or the n-type well 94) may laterally extend under the gate 72 to form the accumulation region 90 of the device 20. The p-type well 94 and/or the drift region 92 may be adjacent to (e.g., line-on-line or contiguous with), and/or spaced from, the body region 66. During operation, charge carriers accumulate in the accumulation region 90 before drifting through across a lateral distance (e.g., length) of the drift region 92 (and/or the n-type well 94) shown in the dimension of the cross-sectional view of FIG. 4.

The conduction path along which the charge carriers flow from the 68 to the drain region 70 passes through, or includes, the drift region 92. The conduction path of the transistor structure 60 may thus include additional or alternative areas or regions having a different conductivity type than the body region 66. The drift region 92 may be configured to allow the charge carriers to drift under the electric field established by the drain-source voltage applied between the drain region 70 and the source region 68. The drift region 92 thus electrically couples the drain region 70 to the channel region 86 and the source region 68 during operation.

In the embodiment of FIG. 3, the drift region 92 is configured as a field drift region. The STI region 82 is disposed between the accumulation region 90 and the drain region 70. Alternative or additional field isolation structures may be disposed between the accumulation region 90 and the drain region 70. For example, the field isolation structures may include one or more field plates disposed above the substrate surface.

The conduction path or regions of the transistor structure 60 may include still other regions, whether n-type or p-type, at or near the substrate surface. For example, the channel region 86 and/or other conduction region of the transistor structure 60 may include one or more intermediately doped n-type transition regions in addition to the extension region 84.

The drift region 92 may be configured for depletion during operation to reduce the magnitude of the electric field in accordance with the reduced surface field (RESURF) effect. The depletion of the dry region 78 may lead to improved breakdown performance. In this example, a junction forms between the n-type well 94 and the p-type epitaxial layer 64 and/or the body region 66 to establish a RESURF effect directed to decreasing the electric field in areas in and/or around the drift region 92. A decreased electric field may avoid breakdown along the conduction path, and thereby increase the intrinsic breakdown voltage (BVdss) of the transistor structure 60. The drift region 92 may be further configured to achieve both a high breakdown voltage level and a low drain-source resistance (Rdson) by leveling the electric field in certain locations within the drift region 92. The drift region 92 may be depleted both laterally and vertically, at least in part, during operation along reverse-biased PN junctions with, for instance, the epitaxial layer 64 and/or the body region 66. The junctions are reverse biased as a result of the application of the drain voltage Vds between the source region 68 and the drain region 70. The reverse-biased junctions may reduce the electric field, as in the RESURF effect, for improved breakdown performance. In an alternative embodiment, the transistor structure 60 may be configured to establish a double RESURF effect, in which, for example, one or more additional regions may be disposed adjacent (e.g., below or under) the drift region 92 for further depletion in the device area.

The shape, dopant concentration profile, and/or other characteristics of the current path and any portions or regions thereof may vary from the example shown. For example, the dopant concentration profile of the drift region 92 in the lateral dimension shown in FIG. 4 may vary. The dopant concentration levels, profiles, and other characteristics of the drift region 92 may vary.

In some cases, the channel region 86 and/or the drift region 92 may include a number of wells or other constituent regions to provide a non-uniform dopant concentration level across the length of the channel region 86 and/or the drift region 92 shown in FIG. 4. The dopant concentration profile and/or level of one or more of the other current path regions may alternatively or additionally vary.

The above-described transistor structures are shown in simplified form. For example, FIGS. 3 and 4 do not show the conductive (e.g., Ohmic) contacts and other metal layers configured for electric coupling of the source, drain, and gate regions and terminals. The devices may have a number of other structures or components for connectivity, isolation, passivation, and other purposes not shown in FIGS. 1-4 for ease in illustration. For instance, the devices may include any number of additional metal layers and corresponding passivation layers disposed in between the metal layers. In some examples, another p-type epitaxial layer (not shown) may be disposed between the original substrate and the device area.

The dopant concentrations, thicknesses, and other characteristics of the above-described semiconductor regions in the semiconductor substrate 62 may vary. In one example of the embodiment shown in FIGS. 3-5, the above-referenced semiconductor regions may have the following approximate concentrations and thicknesses:

|  | Concentration | Thickness |
| --- | --- | --- |
| sources 30, 68: | $1 \times 10^{21}$-$5 \times 10^{21}$/cm$^3$ | 0.15-0.25 µm |
| body contacts 32, 67: | $1 \times 10^{21}$-$5 \times 10^{21}$/cm$^3$ | 0.15-0.25 µm |
| p-epitaxial 64: | $1 \times 10^{13}$-$2 \times 10^{15}$/cm$^3$ | 3-10 µm |
| substrate 66: | $1 \times 10^{15}$-$1 \times 10^{18}$/cm$^3$ | not applicable |
| body 66: | $5 \times 10^{16}$-$1 \times 10^{18}$/cm$^3$ | 0.5-1.5 µm |
| drain 70: | $1 \times 10^{21}$-$5 \times 10^{21}$/cm$^3$ | 0.15-0.25 µm |
| NLDD 84: | $1 \times 10^{18}$-$1 \times 10^{19}$/cm$^3$ | 0.2-0.3 µm |
| n-well 94: | $2 \times 10^{15}$-$1 \times 10^{17}$/cm$^3$ | 0.5-2.5 µm |

The concentrations and thicknesses may be different in other embodiments. For example, the dopant concentration of the original substrate 66 may vary considerably.

Figure 5:
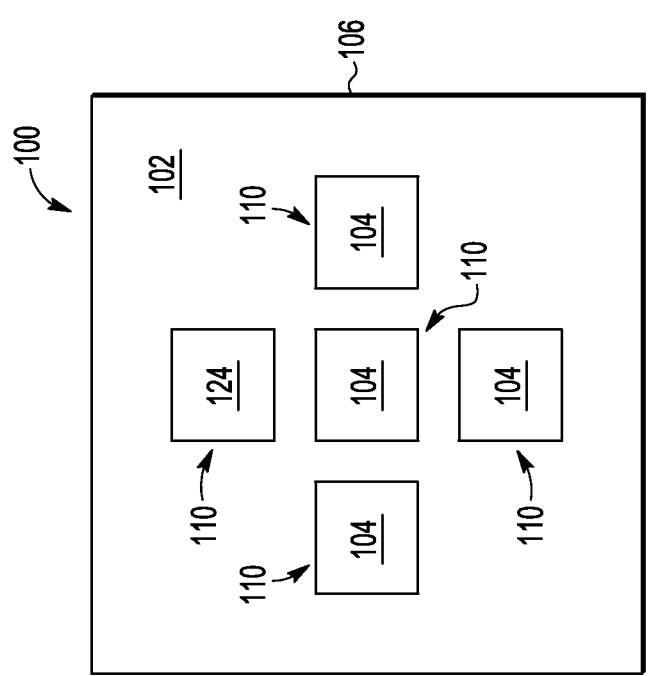
FIG. 5 is a schematic, plan view of another exemplary composite LDMOS transistor device having an arrangement of constituent transistor devices in accordance with one embodiment.

FIG. 5 depicts another exemplary composite transistor device 100 having an arrangement of constituent transistor devices with different threshold voltages. In this example, the composite transistor device 100 includes a primarily peripheral or outer constituent transistor device 102 and multiple inner constituent transistor devices 104. The peripheral constituent device 102 may be configured as described above in connection with the peripheral constituent device 12 of FIGS. 1 and 2. The inner constituent devices 104 may be configured as described above in connection with the central constituent device 13 of FIGS. 1 and 2. The inner devices 104 are spaced from an outer boundary 106 of the composite transistor device 100, and disposed in areas from which heat is not easily removed. In this embodiment, the inner devices 104 are disposed in a central area 108, as well as four areas 110 disposed outwardly from the central area 108 along two lateral directions. Other arrangements may be used for the inner devices 104. For example, a single, cross-shaped inner device 104 may be used instead of the four inner devices 104 shown in FIG. 6.

Each constituent device 102, 104 may include a plurality of transistor structures as described above. For instance, the transistor structures may be disposed in a periodically repeating source-gate-drain arrangement in which adjacent transistor structures share either a source region or a drain region. Further, the source regions may laterally alternate with body contact regions as described above. The transistor structures of the constituent devices 102, 104 are also not isolated from one another, but rather may be contiguous and aligned with one another in an end-to-end abutting relationship, as described above.

The configuration and other features of the constituent transistor devices 102, 104 allow the layout of the composite transistor device 100 to vary considerably. For example, the lack of isolation between the constituent transistor devices 102, 104 allows the layout to vary. The constituent transistor devices 102, 104 may be sized, shaped, and arranged in a wide variety of ways by modifying the layout of the alternating source and body contact regions as described above.

Figure 6:
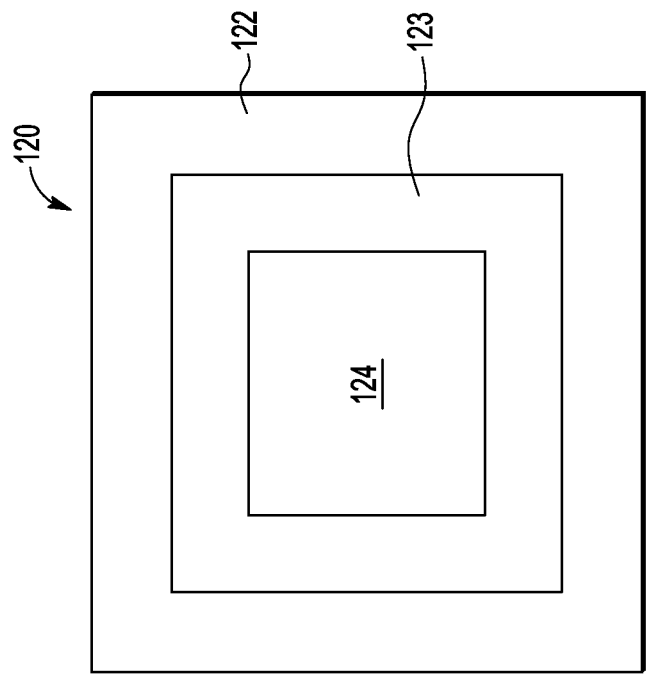
FIG. 6 is a schematic, plan view of another exemplary composite LDMOS transistor device having an arrangement of constituent transistor devices in accordance with one embodiment.

FIG. 6 depicts yet another exemplary layout for a composite transistor device 120 having constituent transistor devices with varying effective channel widths, as described above. In this case, the composite transistor device 120 has three constituent transistor devices 122-124. The constituent transistor device 122 is disposed along a periphery of the composite transistor device 120. The constituent transistor device 124 is disposed with a central, inner area of the composite transistor device 120. The constituent transistor device 123 is disposed between the constituent transistor devices 122, 124. In this example, the three constituent transistor devices 122-124 are disposed in areas that form concentric rings.

The effective channel widths of the three constituent transistor devices 122-124 may increase as the distance from the center of the composite transistor device 120 increases. As the most inwardly disposed constituent device, the constituent transistor device 124 may have the smallest effective channel width. As the most outwardly disposed constituent device, the constituent transistor device 122 may have the largest effective channel width. The constituent transistor device 123 may have an effective channel width between the other two constituent transistor devices. The amount of heat generated by the constituent devices 122-124 may thus vary in accordance with the distance from the periphery.

Figure 7:
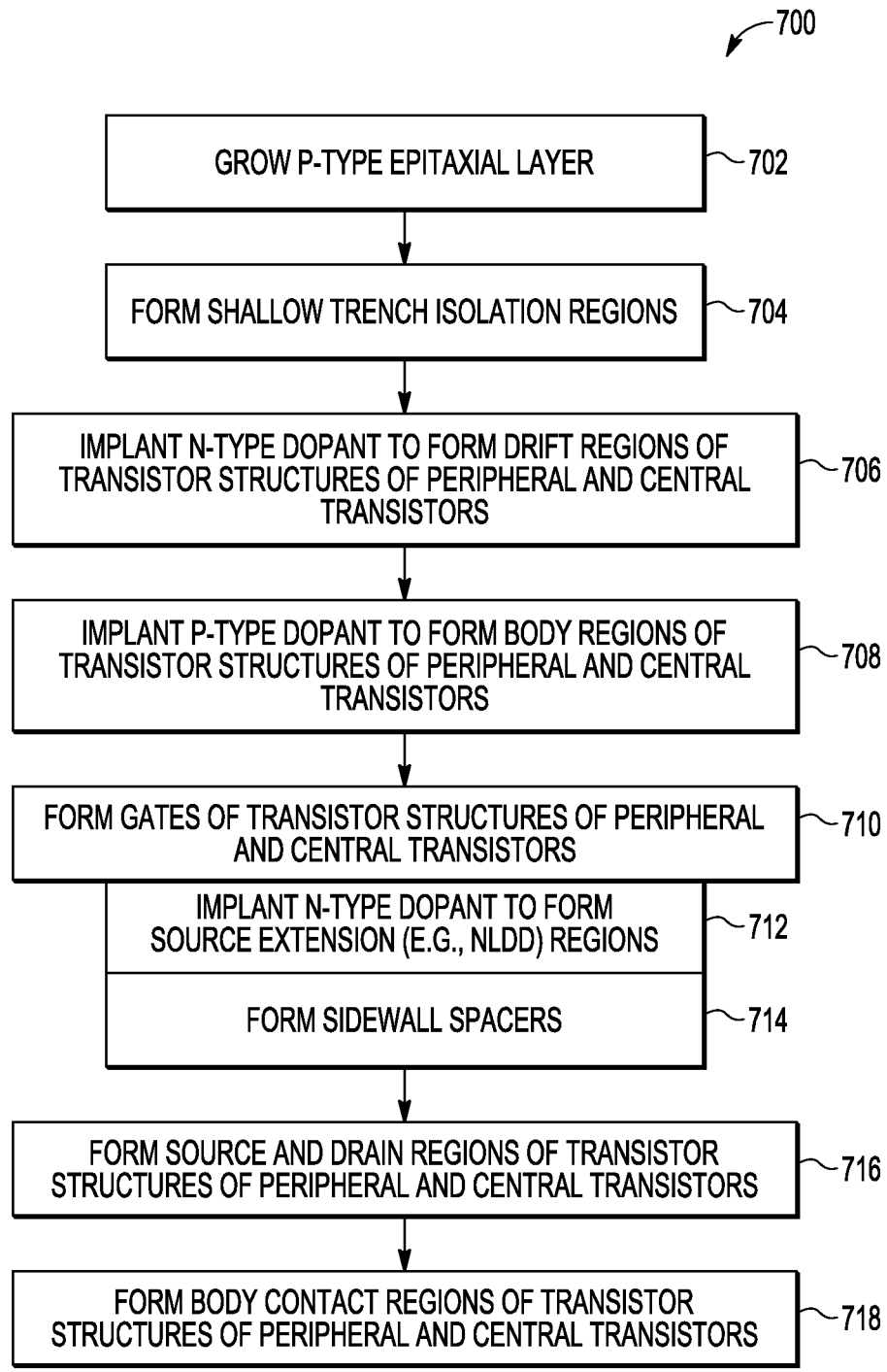
FIG. 7 is a flow diagram of an exemplary fabrication sequence to construct a composite LDMOS transistor device in accordance with one embodiment.

FIG. 7 shows an exemplary fabrication method 700 for fabricating a semiconductor device with an improved thermal SOA as described above. The method may be directed to fabricating a composite transistor device having multiple constituent transistor devices. In the embodiment of FIG. 7, peripheral (or outer) and central (or inner) constituent devices are provided. Each constituent transistor device may be configured as an LDMOS transistor device having one or more of the features described above. For instance, the LDMOS transistor device may include a number of transistor structures configured as reduced surface field (RESURF) transistor structures. The transistor device is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. For example, body regions may be formed before drift regions, effectively reordering acts 706 and 708. The fabrication method is not limited to any particular doping mechanism, and may include future developed doping techniques.

The method may begin with, or include, act 702 in which a p-type epitaxial layer is grown on a heavily doped p-type semiconductor substrate. The substrate may be an SOI or bulk substrate. The act 702 may include the formation of one or more device isolation layers before the growth of the epitaxial layer. The buried device isolation layer may be formed via, e.g., ion implantation, over the buried insulator layer of the SOI substrate. The buried device isolation layer may extend across an entire device area of the composite transistor device. In some cases, the act 702 includes the growth of multiple p-type epitaxial layers. Any number of epitaxial layers may be grown.

In this embodiment, a number of isolation regions are formed at the surface of the substrate in act 704. The isolation regions may be STI regions. The STI regions may include, for instance, field isolation regions, which define the field drift length of each transistor structure of the constituent transistor devices. The isolation regions may be formed via any now known or hereafter developed procedure. For example, the act 704 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region(s) are formed after the drift region is formed.

Other isolation regions may be formed in the act 704. For example, further STI regions and DTI regions may be formed to define an outer boundary of the composite device. Other types of device isolation regions, such as doped isolation regions, may also be used to isolate the composite transistor device. However, as described above, the constituent transistor devices may not be isolated from one another via such regions. As described above, the transistor structures of the constituent transistor devices may be adjacent or contiguous with one another without any isolation region disposed therebetween. For example, ends of the transistor structures may abut one another. Alternatively or additionally, transistor structures of the constituent transistor devices may also be adjacent to one another along a length thereof. The transistor structure of one constituent device may thus share regions (e.g., a drain region) or components (e.g., a gate) with a transistor structure of the other constituent device.

The substrate is doped in act 706 to form well regions in the epitaxial layer. In the embodiment of FIG. 7, n-type dopant is implanted to form a drift region of each transistor structure of the constituent transistor devices. The implantation procedure may be configured with a mask such that well regions are formed as shown in FIGS. 3 and 4. The dopant concentration profile of each well region may vary as described above.

In act 708, the substrate is doped to form body regions of the transistor structures. In this example, p-type dopant is implanted. The implantation procedure may be configured with a mask such that well regions are formed as shown in FIGS. 3 and 4. The body region and the drift region may be disposed line-on-line or spaced apart from one another by a portion of the epitaxial layer.

The fabrication process may then include one or more procedures collectively shown in act 710 directed to the formation of gates of the transistor structures. The procedures may include the deposition or other formation of gate dielectric layers and gate conductive layers (e.g., polysilicon layers). Additional or alternative procedures may be implemented. The gates may be shared by adjacent transistor structures as described above. In some cases, the act 710 includes the formation of source and/or drain extension or transition regions (e.g., NLDD regions) in an act 712. The extension regions may be formed through implantation of dopant (e.g., n-type dopant) before the formation of sidewall spacers of the gates in an act 714. The dopant implantation may be conducted as an angled implant and/or otherwise configured to provide that the extension regions laterally extend under the gates.

In act 716, source and drain regions of the constituent transistor devices are formed. A number of heavy implants may be implemented after formation of the sidewall spacers to align the source regions with the gates. In the embodiments described above, n-type dopant is implanted to form the source and drain regions.

Body contact regions are formed in an act 718. In the embodiments described above, p-type dopant is implanted to form the body contact regions. The source regions and the body contact regions may be disposed in a laterally alternating arrangement as described and shown above in connection with FIG. 2.

The alternating arrangement of the source and body contact regions formed in the acts 716 and 718 is established in accordance with respective photolithographic layouts. As described above, the photolithographic layouts are configured such that the effective channel widths of the transistor structures of the constituent transistors differ. For example, the effective channel width of each transistor structure of a peripheral constituent device may be larger than the effective channel width of each transistor structure of a central constituent device. The photolithographic layout for formation of the source regions may define or establish the sizes (e.g., channel width-establishing dimension) of the source regions in each constituent device. The photolithographic layout for formation of the body contact regions may define or establish the sizes (e.g., channel width-establishing dimension) of the body contact regions in each constituent device. For example, the photolithographic layouts may be configured such that, in the central constituent device, each source region has a smaller size in a channel-establishing dimension than each body contact region. The respective channel-related photolithographic layouts, corresponding dopant implantation procedures, and resulting device regions may vary as described above.

Additional acts may be implemented at various points during the fabrication procedure. For example, a number of acts may anneal the substrate to reposition the dopant ions in the drift or other regions and to repair the substrate after implantation procedures. Other examples of additional acts include depositing and defining one or more metal and passivation layers supported by the substrate.

The above-described semiconductor devices and electronic apparatus have improved energy capability through the formation of a composite transistor arrangement. The composite devices have an improved thermal SOA as a result of the formation of a central or inner constituent transistor device having a higher threshold voltage than a peripheral or outer constituent transistor device. The higher threshold voltage may delay thermal failure until thermal breakdown occurs in the peripheral device. Thermal breakdown may thus be delayed or avoided in the areas (e.g., inner areas) of the composite device in which heat is difficult to remove. The higher threshold voltage is established through the formation of a halo region in the transistor structures of the inner constituent transistor device. The transistor structures of the constituent transistor devices are not isolated from one another. In some cases, the presence of the halo region is the only difference between the constituent transistor devices. The transistor structures of the constituent transistor devices may thus have the same footprint. The area of the halo region may thus define the boundary between the constituent transistor devices. These aspects of the composite device may allow the improvements in thermal SOA to be achieved without any significant detrimental effects on the breakdown voltage level and/or on-resistance of the composite device. An overall increase in device area may thus be avoided.

Although described above in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other devices and/or device configurations. For example, the disclosed devices may have varying RESURF structures, including single, double, or other RESURF structural arrangements, each of which may be referred to herein as a "RESURF transistor."

For convenience of description and without any intended limitation, n-channel LDMOS devices are described and illustrated herein. However, the disclosed devices are not limited to re-channel devices, as p-channel and other types of devices may be provided by, for example, substitution of semiconductor substrate and/or regions of opposite conductivity type. Thus, for example, each semiconductor region, layer or other structure in the examples described herein may have a conductivity type (e.g., n-type or p-type) opposite to the type identified in the examples provided.

Although described in connection with inductive loads, the semiconductor devices described herein are not limited to any particular type of load, circuit, or other application or electronic apparatus. The semiconductor devices may be useful in connection with a wide variety of contexts. The semiconductor devices are not limited to use as a discrete device, and may be incorporated into a wide variety of integrated circuits.

In a first aspect, a device includes a semiconductor substrate, a first constituent transistor including a first plurality of transistor structures in the semiconductor substrate connected in parallel with one another, and a second constituent transistor including a second plurality of transistor structures in the semiconductor substrate connected in parallel with one another. The first and second constituent transistors are disposed laterally adjacent to one another and connected in parallel with one another. Each transistor structure of the first plurality of transistor structures has a lower resistance in a saturation region of operation than each transistor structure of the second plurality of transistor structures.

In a second aspect, a device includes a semiconductor substrate, a first constituent transistor including a first plurality of transistor structures in the semiconductor substrate connected in parallel with one another, and a second constituent transistor including a second plurality of transistor structures in the semiconductor substrate connected in parallel with one another. The first and second constituent transistors are disposed laterally adjacent to one another and connected in parallel with one another. An effective channel width of each transistor structure of the first plurality of transistor structures is larger than an effective channel width of each transistor structure of the second plurality of transistor structures.

In a third aspect, a method of fabricating a device in a semiconductor substrate. The method includes forming body regions in the semiconductor substrate of first and second pluralities of transistor structures of first and second constituent transistors, respectively, the first and second transistors being adjacent to one another, the body regions having a first conductivity type. Gates of the first and second pluralities of transistor structures are formed over the semiconductor substrate. A source region is formed in each body region in the semiconductor substrate of the first and second pluralities of transistor structures in accordance with a first photolithographic layout, the source region having a second conductivity type. A body contact region is formed in each body region in the semiconductor substrate of the first and second pluralities of transistor structures in accordance with a second photolithographic layout, the body contact regions having the first conductivity type. The first and second photolithographic layouts are configured such that an effective channel width of each transistor structure of the first plurality of transistor structures is larger than an effective channel width of each transistor structure of the second plurality of transistor structures.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

Embodiments of the present invention are defined by the following claims and their equivalents, and nothing in this section should be taken as a limitation on those claims. Further aspects and advantages of the invention are discussed above in conjunction with the preferred embodiments and may be later claimed independently or in combination.

While the disclosure has described various embodiments, it should be understood that many changes and modifications may be made without departing from the scope of the disclosure. It is therefore intended that the foregoing detailed description be regarded as illustrative rather than limiting, and that it be understood that it is the following claims, including all equivalents, that are intended to define the spirit and scope of this disclosure.

The invention claimed is:

1. A device comprising:
   a semiconductor substrate;
   a first constituent transistor comprising a first plurality of transistor structures in the semiconductor substrate connected in parallel with one another; and
   a second constituent transistor comprising a second plurality of transistor structures in the semiconductor substrate connected in parallel with one another;
   wherein the first and second constituent transistors are disposed laterally adjacent to one another and connected in parallel with one another;
   wherein each transistor structure of the first and second pluralities of transistor structures comprises a plurality of source regions and a plurality of body contact regions disposed in an alternating arrangement with the plurality of source regions along a lateral dimension of the device; and
   wherein each transistor structure of the first plurality of transistor structures has a lower resistance in a saturation region of operation than each transistor structure of the second plurality of transistor structures due to a layout difference in the alternating arrangement between the first and second pluralities of transistor structures.

2. The device of claim 1, wherein the second plurality of transistor structures are laterally surrounded by the first plurality of transistor structures.

3. The device of claim 1, wherein the second plurality of transistor structures are centered within the first plurality of transistor structures.

4. The device of claim 1, wherein the first and second pluralities of transistor structures are not electrically isolated from one another.

5. The device of claim 1, wherein the first and second constituent transistors are laterally diffused metal-oxide-semiconductor (LDMOS) transistors.

6. The device of claim 1, wherein:
   each transistor structure of the first and second pluralities of transistor structures comprises a body region in which a channel is formed during operation;
   the channel of each transistor structure of the first and second pluralities of transistor structures is oriented in a first lateral direction; and
   the first and second constituent transistors are laterally contiguous with one another in a second lateral direction orthogonal to the first lateral direction.

7. The device of claim 1, wherein a respective transistor structure of the first plurality of transistor structures is aligned with a respective transistor structure of the second plurality of transistor structures such that the respective transistor structures share a common gate supported by the semiconductor substrate.

8. The device of claim 1, wherein the second constituent transistor is disposed in an inner area and the first constituent transistor is disposed outwardly from the inner area.

9. The device of claim 1, wherein the layout difference incorporates a plurality of shallow trench isolation regions into the alternating arrangement for the second plurality of transistor structures to establish the lower resistance of each transistor structure of the first plurality of transistor structures.

10. A device comprising:
    a semiconductor substrate;
    a first constituent transistor comprising a first plurality of transistor structures in the semiconductor substrate connected in parallel with one another; and
    a second constituent transistor comprising a second plurality of transistor structures in the semiconductor substrate connected in parallel with one another;
    wherein the first and second constituent transistors are disposed laterally adjacent to one another and connected in parallel with one another;
    wherein each transistor structure of the first plurality of transistor structures has a lower resistance in a saturation region of operation than each transistor structure of the second plurality of transistor structures; and
    wherein an effective channel width of each transistor structure of the first plurality of transistor structures is larger than an effective channel width of each transistor structure of the second plurality of transistor structures.

11. The device of claim 10, wherein each transistor structure of the first and second pluralities of transistor structures comprises a plurality of source regions and a plurality of body contact regions disposed in an alternating arrangement with the plurality of source regions along a lateral dimension of the device.

12. The device of claim 11, wherein the alternating arrangement establishes the effective channel width of each transistor structure.

13. The device of claim 11, wherein, in the second plurality of transistor structures, each source region of the plurality of source regions has a smaller size in a channel-establishing dimension than each body contact region of the plurality of body contact regions.

14. A device comprising:
    a semiconductor substrate;
    a first constituent transistor comprising a first plurality of transistor structures in the semiconductor substrate connected in parallel with one another; and
    a second constituent transistor comprising a second plurality of transistor structures in the semiconductor substrate connected in parallel with one another;

wherein the first and second constituent transistors are disposed laterally adjacent to one another and connected in parallel with one another; and wherein an effective channel width of each transistor structure of the first plurality of transistor structures is larger than an effective channel width of each transistor structure of the second plurality of transistor structures.

15. The device of claim 14, wherein each transistor structure of the first and second pluralities of transistor structures comprises a plurality of source regions and a plurality of body contact regions disposed in an alternating arrangement with the plurality of source regions along a lateral dimension of the device.

16. The device of claim 15, wherein the alternating arrangement establishes the effective channel width of each transistor structure.

17. The device of claim 15, wherein:
the alternating arrangement establishes, for each transistor structure of the first and second plurality of transistor structures, a collective size of the plurality of body contact regions in a channel-establishing dimension and a collective size of the plurality of source regions in the channel-establishing dimension; and for each transistor structure of the second plurality of transistor structures, the collective size of the plurality of body contact regions is greater than the collective size of the plurality of source regions.

18. The device of claim 14, wherein the second plurality of transistor structures are laterally surrounded by the first plurality of transistor structures.

19. The device of claim 14, wherein the second constituent transistor is disposed in an inner area and the first constituent transistor is disposed outwardly from the inner area.

20. A device comprising:
a semiconductor substrate;
a first constituent transistor comprising a first plurality of transistor structures in the semiconductor substrate connected in parallel with one another; and
a second constituent transistor comprising a second plurality of transistor structures in the semiconductor substrate connected in parallel with one another;
wherein the first and second constituent transistors are disposed laterally adjacent to one another and connected in parallel with one another;
wherein each transistor structure of the first plurality of transistor structures has a lower resistance in a saturation region of operation than each transistor structure of the second plurality of transistor structures; and
wherein the second constituent transistor is disposed in an inner area and the first constituent transistor is disposed outwardly from the inner area.

\* \* \* \* \*